United States Patent
Lee et al.

(10) Patent No.: US 12,016,240 B2
(45) Date of Patent: Jun. 18, 2024

(54) DISPLAY DEVICE AND METHOD OF MANUFACTURING THE SAME

(71) Applicant: Samsung Display Co., Ltd., Yongin-si (KR)

(72) Inventors: Sunhee Lee, Yongin-si (KR); Pilsuk Lee, Yongin-si (KR); Juchan Park, Yongin-si (KR); Younggug Seol, Yongin-si (KR)

(73) Assignee: Samsung Display Co., Ltd., Yongin -Si (KR)

( * ) Notice: Subject to any disclaimer, the term of this patent is extended or adjusted under 35 U.S.C. 154(b) by 338 days.

(21) Appl. No.: 15/726,194

(22) Filed: Oct. 5, 2017

(65) Prior Publication Data

US 2018/0175310 A1    Jun. 21, 2018

(30) Foreign Application Priority Data

Oct. 17, 2016   (KR) .................. 10-2016-0134548

(51) Int. Cl.
*H10K 77/10*     (2023.01)
*B32B 3/26*      (2006.01)
(Continued)

(52) U.S. Cl.
CPC .............. *H10K 77/111* (2023.02); *B32B 3/26* (2013.01); *B32B 27/08* (2013.01); *B32B 27/281* (2013.01);
(Continued)

(58) Field of Classification Search
CPC ......... H01L 51/0097; H01L 2251/5338; H01L 2251/538; H01L 27/3246; H01L 51/5253; G02F 1/133305; H05K 1/028; H05K 1/0353; G06F 1/1652; G06F 1/1641; B32B 27/08; B32B 27/281; B32B 2457/206;
(Continued)

(56) References Cited

U.S. PATENT DOCUMENTS 7,868,545 B2   1/2011   Hioki et al.
8,237,165 B2   8/2012   Kim et al.
(Continued)

FOREIGN PATENT DOCUMENTS

JP    2008-026710 A    2/2008
JP    2016-059030 A    4/2016
(Continued)

OTHER PUBLICATIONS

Espacenet translation of WO-2016163258-A1, accessed on Mar. 13, 2020. (Year: 2016).*

(Continued)

*Primary Examiner* — Jeremy R Pierce
*Assistant Examiner* — Christine X Nisula
(74) *Attorney, Agent, or Firm* — Innovation Counsel LLP

(57) ABSTRACT

A display device includes a reinforced substrate; and a display layer disposed on the reinforced substrate and configured to display an image, wherein the reinforced substrate includes a first reinforced layer including a flexible region including a plurality of patterns spaced apart from one another; and a first substrate disposed on the first reinforced layer and has flexibility. A modulus of elasticity of the first reinforced layer is greater than a modulus of elasticity of the first substrate.

14 Claims, 11 Drawing Sheets

(51) Int. Cl.
  *B32B 27/08* (2006.01)
  *B32B 27/28* (2006.01)
  *H10K 50/844* (2023.01)
  *H10K 59/12* (2023.01)
  *B32B 3/10* (2006.01)
  *H10K 85/20* (2023.01)
  *H10K 102/00* (2023.01)

(52) U.S. Cl.
  CPC ........... *H10K 50/844* (2023.02); *H10K 59/12* (2023.02); *B32B 3/10* (2013.01); *B32B 2307/51* (2013.01); *B32B 2307/54* (2013.01); *B32B 2457/206* (2013.01); *H10K 85/20* (2023.02); *H10K 85/221* (2023.02); *H10K 2102/311* (2023.02); *Y02E 10/549* (2013.01)

(58) Field of Classification Search
  CPC .... H04K 1/028; G09G 2380/02; G09F 9/301; H10K 77/111; H10K 2102/311
  See application file for complete search history.

(56) References Cited

U.S. PATENT DOCUMENTS

| | | |
|---|---|---|
| 9,189,027 B2 | 11/2015 | Lee et al. |
| 9,276,047 B2 | 3/2016 | Ko et al. |
| 9,655,235 B2 | 5/2017 | Hwang et al. |
| 9,829,924 B2 | 11/2017 | Shin et al. |
| 10,416,721 B2 | 9/2019 | Shin et al. |
| 2014/0029212 A1* | 1/2014 | Hwang .................. H05K 1/028 361/749 |
| 2014/0037928 A1* | 2/2014 | Lee ...................... H01L 51/0097 428/218 |
| 2014/0167006 A1 | 6/2014 | Kim |
| 2014/0287213 A1 | 9/2014 | Lee et al. |
| 2015/0049428 A1* | 2/2015 | Lee ........................ G06F 1/1652 361/679.27 |
| 2015/0077953 A1* | 3/2015 | Namkung ............... H05K 3/28 361/751 |
| 2017/0092884 A1* | 3/2017 | Zhang ................ H01L 51/0097 |

FOREIGN PATENT DOCUMENTS

| | | | |
|---|---|---|---|
| JP | 2016-173939 A | 9/2016 | |
| KR | 10-2010-0130898 | 12/2010 | |
| KR | 10-2012-0063930 A | 6/2012 | |
| KR | 10-2014-0015881 A | 2/2014 | |
| KR | 10-2014-0024216 | 2/2014 | |
| KR | 10-2014-0077624 | 6/2014 | |
| KR | 10-2014-0115178 A | 9/2014 | |
| KR | 10-2015-0020446 A | 2/2015 | |
| KR | 10-2015-0021167 | 3/2015 | |
| KR | 10-2016-0006585 A | 1/2016 | |
| KR | 10-2016-0017843 A | 2/2016 | |
| KR | 10-2016-0070595 A | 6/2016 | |
| WO | 2014/027761 | 2/2014 | |
| WO | WO-2016163258 A1 * | 10/2016 | ............. H01L 29/41 |

OTHER PUBLICATIONS

Merriam-Webster, "Separate", merriam-webster.com/dictionary/separated (Year: 2020).*
Korean Notice of Allowance corresponding to Application No. 10-2016-0134548 and dated Jun. 20, 2023, 3 pages.

* cited by examiner

DISPLAY DEVICE AND METHOD OF MANUFACTURING THE SAME

CROSS-REFERENCE TO RELATED APPLICATION

This application claims the benefit of Korean Patent Application No. 10-2016-0134548, filed on Oct. 17, 2016, in the Korean Intellectual Property Office, the disclosure of which is incorporated herein in its entirety by reference.

BACKGROUND

1. Field

The present disclosure relates to a display device and a method of manufacturing the same, and more particularly, to a flexible display device having increased stiffness and a method of manufacturing the same.

2. Description of the Related Art

Recently, there has been an increasing demand for large screens in small portable devices, such as mobile phones and electronic tablets. Researches are being actively made to develop a flexible display device including a screen that may be folded to occupy a less space while not in use and to display an image by being unfolded while in use.

In order to implement a flexible display device, it is necessary to fabricate a substrate and a display to be thin enough to provide the desired flexibility.

However, in the case of a display device having a reduced thickness as described above, a display may be damaged by being compressed and deformed due to a small impact from the outside. Furthermore, when the stiffness of a substrate is increased to prevent such a problem, the flexibility of the entire display device is deteriorated.

SUMMARY

One or more embodiments include a display device including a reinforced layer that includes a substrate and a patterned flexible region. The reinforced layer has a modulus of elasticity greater than a modulus of elasticity of the substrate, and a method of manufacturing the display device. The display device provides flexibility in the flexible region and improves the overall stiffness using the reinforced layer.

Additional aspects will be set forth in part in the description which follows and, in part, will be apparent from the description, or may be learned by practice of the presented embodiments.

According to one or more embodiments, a display device includes a reinforced substrate; and a display layer disposed on the reinforced substrate and configured to display an image, wherein the reinforced substrate includes a first reinforced layer including a flexible region including a plurality of patterns spaced apart from one another; and a first substrate disposed on the first reinforced layer and has flexibility, and a modulus of elasticity of the first reinforced layer is greater than a modulus of elasticity of the first substrate.

The first substrate may be configured to surround at least three surfaces of the first reinforced layer.

A bottom surface of the first reinforced layer may not be surrounded by the first substrate.

The modulus of elasticity of the first reinforced layer is equal to or greater than 10 GPa.

The first reinforced layer may include a conductive material.

The conductive material may include any one selected from a group including molybdenum (Mo), titanium (Ti), silver (Ag), carbon nanotubes (CNT), and graphene.

A width of the plurality of patterns in the flexible region may be less than or equal to about 120 μm.

The plurality of patterns in the flexible region has different sizes and shapes.

The first reinforced layer may include a plurality of flexible regions.

In the flexible region, the first reinforced layer may include a supporter and a convex portion protruding from the supporter.

The first substrate may fill spaces between adjacent patterns in the flexible region.

The display device may further include a first barrier layer disposed on the reinforced substrate.

The display device may further include a second substrate disposed on the first barrier layer and has flexibility; and a second barrier layer disposed on the second substrate.

The display device may further include a second substrate, which is disposed below the first substrate and has flexibility; and a second barrier layer disposed on the second substrate.

The display device may further include a second reinforced layer comprising a second flexible region and surrounded by the second substrate on at least three surfaces, wherein a modulus of elasticity of the second reinforced layer may be greater than a modulus of elasticity of the second substrate.

According to one or more embodiments, a method of manufacturing a display device, the method includes disposing a first reinforced layer including a flexible region on a carrier substrate; disposing a first substrate having flexibility on the first reinforced layer, and disposing a display layer configured to display an image on the first substrate, wherein a modulus of elasticity of the first reinforced layer is greater than a modulus of elasticity of the first substrate.

The method may further include disposing a first barrier layer on the first substrate before disposing the display layer.

The method may further include, after disposing the first barrier layer, disposing of a second substrate having flexibility on the first barrier layer; and disposing a second barrier layer on the second substrate.

The method may further include, before disposing the first reinforced layer, disposing a second substrate having flexibility on the carrier substrate; and disposing a first barrier layer on the second substrate.

The method may further include, before disposing the second substrate, disposing a second reinforced layer including a second flexible region, wherein a modulus of elasticity of the second reinforced layer may be greater than a modulus of elasticity of the second substrate.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
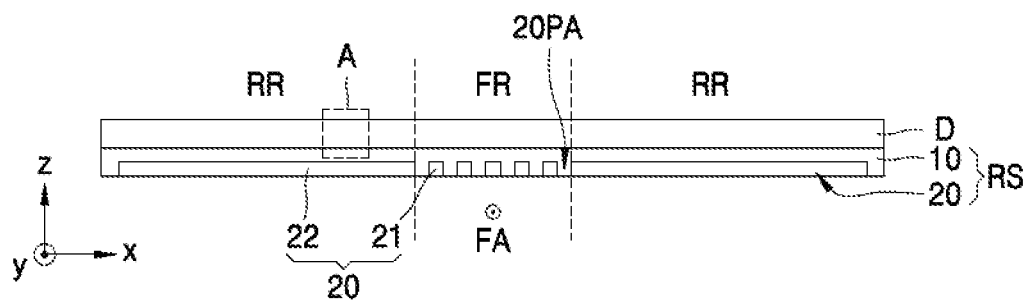
FIG. 1 is a schematic cross-sectional diagram showing a display device, according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Therefore, the embodiments are merely described below, by referring to the figures, to explain aspects of the present disclosure. As used herein, the term "and/or" includes any and all combinations of one or more of the associated listed items. Expressions such as "at least one of", when preceding a list of elements, modify the entire list of elements and do not modify the individual elements of the list.

As embodiments allows for various changes and numerous embodiments, particular embodiments will be illustrated in the drawings and described in detail in the written description. However, this is not intended to limit embodiments to particular modes of practice, and it is to be appreciated that all changes, equivalents, and substitutes that do not depart from the spirit and technical scope of the embodiments are encompassed. In the descriptions of embodiments, certain detailed explanations of the related art may be omitted when it is deemed that they may unnecessarily obscure the essence of the embodiments.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, one or more intervening layers, regions, or components may be present.

In the following embodiments, the x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

Sizes of elements in the drawings may be exaggerated for convenience of explanation. In other words, since sizes and thicknesses of components in the drawings may be arbitrarily illustrated for convenience of explanation, the following embodiments are not limited thereto.

Hereinafter, example embodiments will be described in detail with reference to the accompanied drawings, where like reference numerals denote like or corresponding elements throughout, and redundant descriptions thereof may be omitted.

FIG. 1 is a schematic cross-sectional diagram showing a display device, according to an example embodiment.

The display device includes a reinforced substrate RS and a display layer D disposed on the reinforced substrate RS and configured to display an image. The reinforced substrate RS includes a first reinforced layer 20 including patterns 21 in a flexible region FR and a reinforced layer 22 in a reinforced region RR, and a first substrate 10 disposed on the first reinforced layer 20. The modulus of elasticity of the first reinforced layer 20 is greater than the modulus of elasticity of the first substrate 10.

Referring to FIG. 1, the reinforced substrate RS including the first substrate 10 and the first reinforced layer 20 supports the display layer D.

The first substrate 10 may include various flexible materials. For example, the first substrate 10 may include a polymer resin, such as polyethersulphone (PES), polyacrylate (PAR), polyetherimide (PEI), polyethylene (PEN), polyethyleneterephthalate (PET), polyphenylene sulfide (PPS), polyallylate, polyimide (PI), polycarbonate (PC), or cellulose acetate propionate (CAP). The first substrate 10 may have a thickness ranging from several micrometers (μm) to tens of micrometers.

The first reinforced layer 20 is disposed below the first substrate 10. The first reinforced layer 20 includes the flexible region FR, which will be described later.

According to an example embodiment, the first substrate 10 may surround at least three sides of the first reinforced layer 20. Referring to FIG. 1, the first substrate 10 surrounds the top surface and two side surfaces of the first reinforced layer 20. The first substrate 10 and the top surface of the first reinforced layer 20 may directly contact each other.

According to an example embodiment, the bottom surface of the first reinforced layer 20 may not be surrounded by the first substrate 10. Referring to FIG. 1, surfaces of the first reinforced layer 20 except the bottom surface of the first reinforced layer 20 may be surrounded by the first substrate 10 and, when the display device is viewed from below, the bottom surface of the first reinforced layer 20 may be exposed. In other words, the first reinforced layer 20 may not be completely surrounded by the first substrate 10.

Figure 2A:
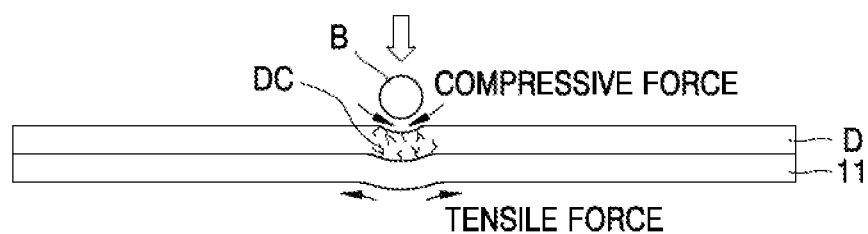
FIGS. 2A and 2B are cross-sectional diagrams showing a comparison between effects of a display device in a related art and effects of the display device shown in FIG. 1.
Figure 2B:
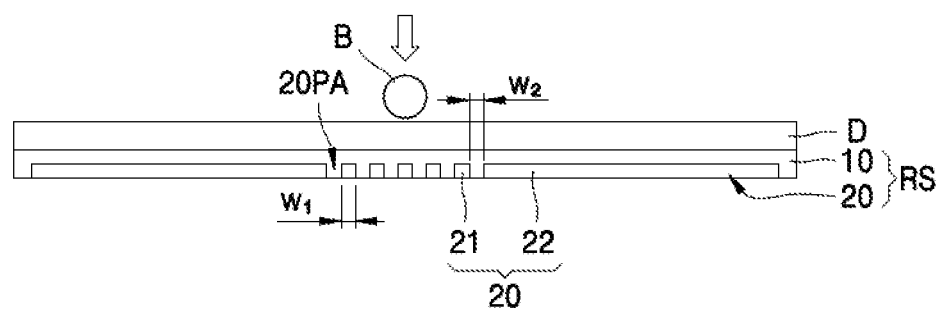

FIGS. 2A and 2B are cross-sectional diagrams showing a comparison between effects of a display device in a related art and effects of the display device shown in FIG. 1. FIG. 2A shows a display device that does not include the first reinforced layer 20. The display device includes a substrate 11 that may have a small modulus of elasticity. When an object, such as a pen or a ball B, falls onto the display device and applies an impact to the display device, the top surface of the display layer D receives a compressive force, whereas the bottom surface receives a tensile force and is bent downwardly. The substrate 11 supporting the display layer D has flexibility, and thus the display layer D is unable to prevent the display layer D from being bent and is bent together with the substrate 11. Therefore, the bottom surface of the display layer D may be bent to form a crack DC. For example, when the display layer D is an organic light emitting display device, the crack DC may be formed at an inorganic film, such as a gate insulating film of a thin-film transistor (TFT) or an inorganic layer of a thin film encapsulation (TFE). Detailed description thereof will be given later.

FIG. 2B shows an embodiment including the reinforced substrate RS. The modulus of elasticity of the first reinforced layer 20 disposed in the reinforced substrate RS is greater than the modulus of elasticity of the first substrate 10. A modulus of elasticity is a value representing stiffness of a material and may be defined as an external stress divided by a strain (a ratio of deformation under the external stress). The greater the modulus of elasticity is, the smaller the degree of deformation of a shape subject to an external stress. In other words, since the first reinforced layer 20 has a greater modulus of elasticity than the first substrate 10, the first reinforced layer 20 may include a relatively hard material as compared to the material of the first substrate 10. Therefore, the overall strength of the reinforced substrate RS may be increased due to the first reinforced layer 20. In a case where an object, such as a pen or a ball B, falls onto the display device and applies an impact to the display device including the reinforced substrate RS, even when the first substrate 10 includes a flexible material, the first reinforced layer 20 prevents the display layer D from being excessively bent to form a crack.

According to an example embodiment, the modulus of elasticity of the first reinforced layer 20 may be equal to or greater than 10 GPa.

For example, when the first substrate 10 includes a plastic, such as polyimide (PI), the first substrate 10 has a modulus of elasticity of about 3 GPa, wherein the modulus of elasticity of the first reinforced layer 20 may be equal to or greater than 10 GPa.

According to an example embodiment, the first reinforced layer 20 may include a conductive material. In this case, an electro-magnetic interference (EMI) shielding function may be provided to the display device without separately arranging an EMI shielding film therein.

According to an example embodiment, the first reinforced layer 20 may include a conductive metal. The conductive metal may include any one selected from a group including molybdenum (Mo), titanium (Ti), and silver (Ag). The modulus of elasticity of molybdenum (Mo), titanium (Ti), and silver (Ag) are about 200 GPa, about 116 GPa, and about 83 GPa, respectively. Since molybdenum (Mo), titanium (Ti), and silver (Ag) have a modulus of elasticity around 100 GPa, the strength of the reinforced substrate RS may be increased by having a thickness of 0.1 μm or more.

According to an example embodiment, the first reinforced layer 20 may include a conductive flexible film. The conductive flexible film may include any one selected from a group including carbon nanotubes (CNTs) and graphene. Carbon-based materials, such as carbon nanotubes (CNTs) and graphene, may have a modulus of elasticity around 1000 GPa that is greater than a modulus of elasticity of the conductive metal. Since carbon nanotubes (CNTs) and graphene are stronger than metals, the thicknesses of the carbon nanotubes (CNTs) and the graphene may be smaller than the thicknesses of conductive metals to achieve the same strength.

According to an example embodiment, the first reinforced layer 20 may include an inorganic material, wherein the modulus of elasticity of the first reinforced layer 20 may be equal to or greater than 10 GPa. For example, the inorganic material may include a silicon oxide ($SiO_x$) or a silicon nitride ($SiN_x$) that is non-conductive.

The silicon oxide ($SiO_x$) or the silicon nitride ($SiN_x$) may have a modulus of elasticity of 100 GPa or higher depending on deposition conditions, and thus the strength of the reinforced substrate RS may be improved.

Figure 3:
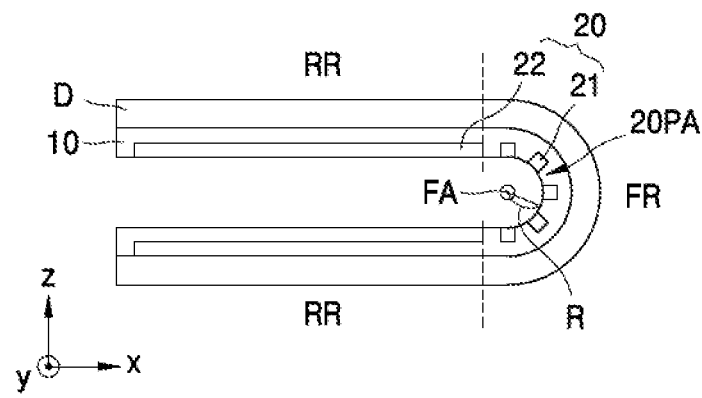
FIG. 3 is a cross-sectional view of the display device shown in FIG. 1 when the display device is folded.

FIG. 3 is a cross-sectional view of the display device shown in FIG. 1 when the display device is folded.

Referring to FIGS. 1 and 3, the first reinforced layer 20 in the display device includes the flexible region FR. In particular, FIG. 3 shows the display device shown in FIG. 1 as being folded around a folding axis FA parallel to the y-axis. In this case, the display device has a curvature radius of R in the flexible region FR.

The patterned region of the first reinforced layer 20 corresponds to the flexible region FR of the display device, whereas the unpatterned region of the first reinforced layer 20 corresponds to the reinforced region RR. The flexible region FR refers to a region that has a flexible shape and may be deformed by being folded or bent. On the contrary, the reinforced region RR refers to a region with a fixed shape. Here, terms including 'fixed', 'folded', 'bent', and 'deformable' refer to relative degrees of differences between the flexible region FR and the reinforced region RR. In other words, the reinforced region RR of the first reinforced layer 20 may also be flexible but at a lesser degree compared to the flexible region FR.

The first reinforced layer 20 has a relatively high modulus of elasticity as described above, may be difficult to bend or fold. However, when the first reinforced layer 20 is patterned to have a plurality of patterns 21 as shown in FIGS. 1 and 3, the patterned region becomes bendable due to a space 20PA between the adjacent patterns 21 of the first reinforced layer 20. Therefore, the region in which the first reinforced layer 20 is patterned corresponds to the flexible region FR of the reinforced substrate RS. On the other hand, it is difficult to bend or fold a region where the first reinforced layer 20 is not patterned. The unpatterned region corresponds to the reinforced region RR that improves the strength of the reinforced substrate RS.

The patterns 21 in the flexible region FR of the first reinforced layer 20 can contribute to the improvement of the strength of the reinforced substrate RS. Referring to FIG. 2B, even when an object, such as a ball, falls onto the flexible region FR of the display device and applies an impact thereto, since the patterns 21 in the flexible region FR can absorb the impact, the display device may be prevented from being bent and damaged.

According to an example embodiment, the pattern width of the patterns 21 in the flexible region FR may be less than or equal to about 120 μm. Referring to FIG. 2B, as the width w1 of the patterns and the width w2 of the space 20PA between adjacent patterns 21 decrease, the flexibility of the flexible region FR may be improved, but a more precise process is required for patterning. Generally, in an experiment for applying an impact to a display device, the width of a pen contacting the display device is about 0.12 mm (120

μm), and the width of a ball is about 0.80 mm (800 μm). Therefore, when the width w1 of the patterns 21 in the flexible region FR and the width w2 of the space 20 PA between adjacent patterns 21 are less than about 120 μm, the reinforced substrate RS may efficiently absorb an impact caused by a pen drop while achieving a flexible property.

The display includes the first reinforced layer 20 including the flexible region FR including a plurality of patterns 21 and having a modulus of elasticity greater than the modulus of elasticity of the first substrate 10, thereby providing the flexibility at the flexible region FR and improving the overall strength of the display device.

Figure 4A:
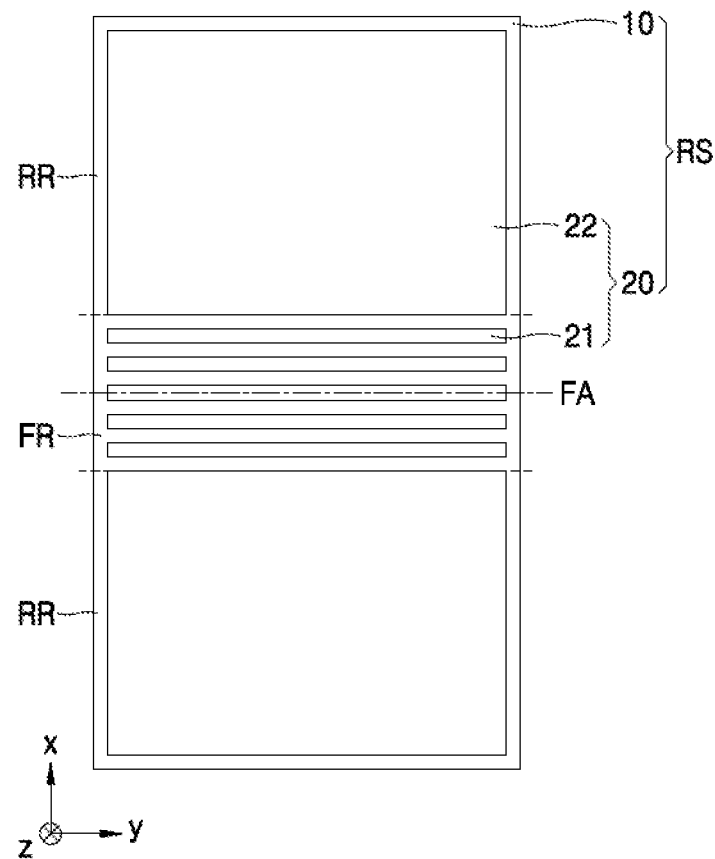
FIGS. 4A through 4C are bottom views of a display device showing various embodiments of a first reinforced layer.
Figure 4B:
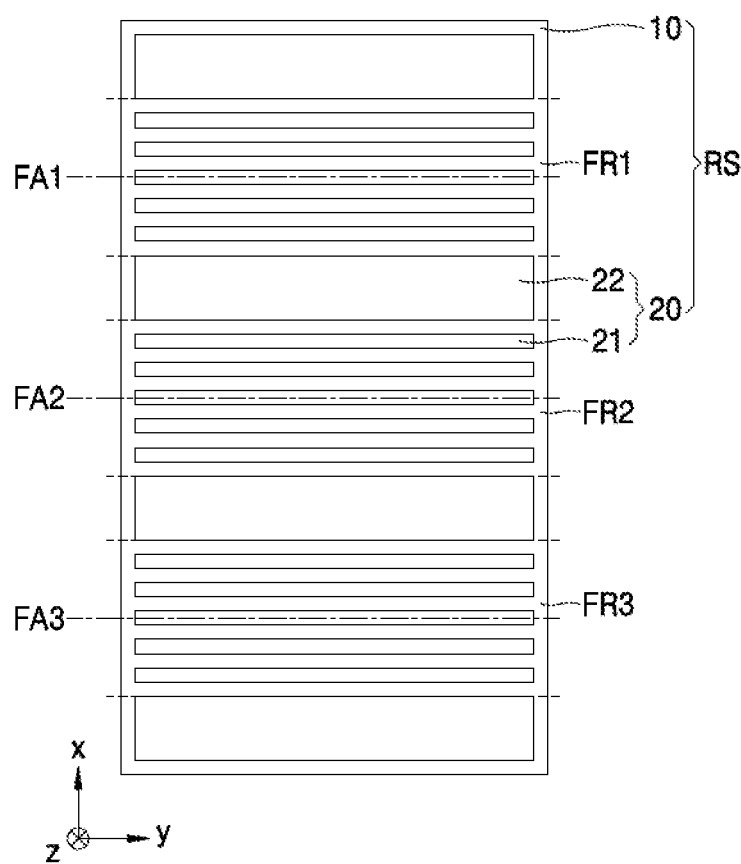
Figure 4C:
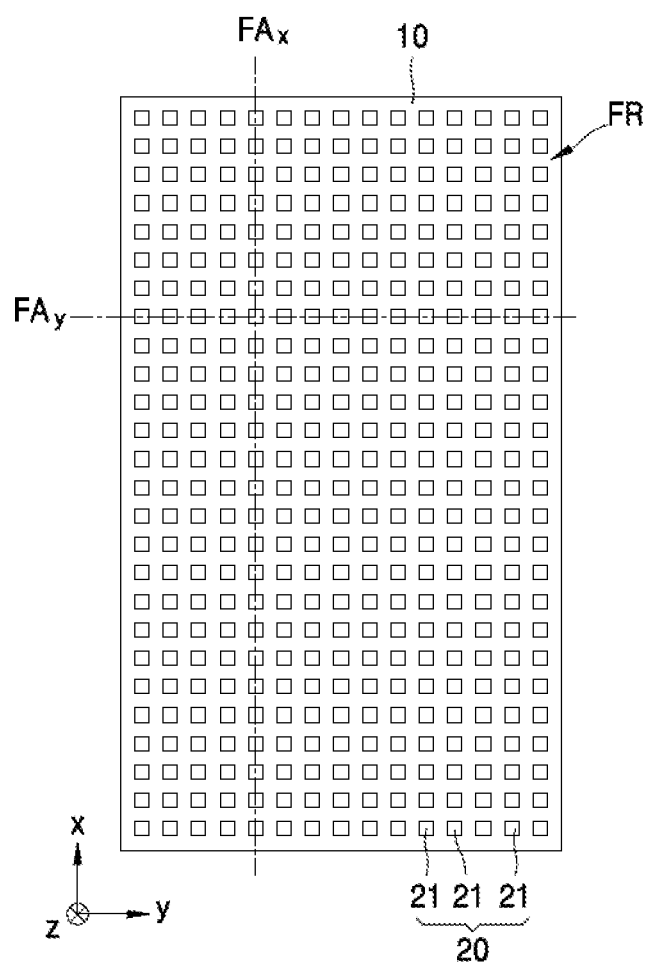

FIGS. 4A through 4C are bottom views of a display device showing various embodiments of a first reinforced layer.

According to an example embodiment, in the flexible region FR, the first reinforced layer 20 may include a plurality of patterns 21 that are spaced apart from one another. Referring to FIGS. 1 and 4A, the first reinforced layer 20 has the plurality of patterns 21 in the flexible region FR, and a reinforced layer 22 is arranged in the reinforced region RR on each side of the display device as one large rectangular shape.

In FIG. 4A, the flexible region FR is disposed at a center region of the display device.

The display device as described above can be folded around the folding axis FA parallel to the y-axis. The folded region may correspond to the flexible region FR.

According to an example embodiment, the first reinforced layer 20 may include a plurality of flexible regions. Referring to FIG. 4B, a display device including three flexible regions FR1, FR2, and FR3 is shown as an example. In other words, the first reinforced layer 20 may be patterned in the first flexible region FR1, the second flexible region FR2, and the third flexible region FR3 that are folded around a first folding axis FA1, a second folding axis FA2, and a third folding axis FA3, respectively. Unlike the display device shown in FIG. 3, the display device shown in FIG. 4B may be folded in a plurality of regions.

According to an example embodiment, the flexible region FR may be disposed throughout the display device. Referring to FIG. 4C, the first reinforced layer 20 is patterned throughout the display device to include the patterns 21 having a small rectangular shape exposed on the bottom surface of the display device in a matrix-like shape. In such a case, the display device may be folded around a folding axis FAy parallel to the y-axis and a folding axis FAx parallel to the x-axis. In other words, in this case, the display device may be folded horizontally or vertically.

Although FIGS. 4A through 4C show that the patterns 21 in the flexible region FR of the first reinforced layer 20 is constant, embodiments are not limited thereto. For example, the width of the patterns 21 of the first reinforced layer 20 may be different in the first flexible region FR1 and the second flexible region FR2, and the curvature radii in the first flexible region FR1 and the second flexible region FR2 may be different. Furthermore, various other modifications may be made in the shape of the pattern 21 in the flexible region FR of the first reinforced layer 20. For example, the folding axis FA around which the display device is folded may not be parallel to an edge of the display device having a rectangular shape.

Figure 5A:
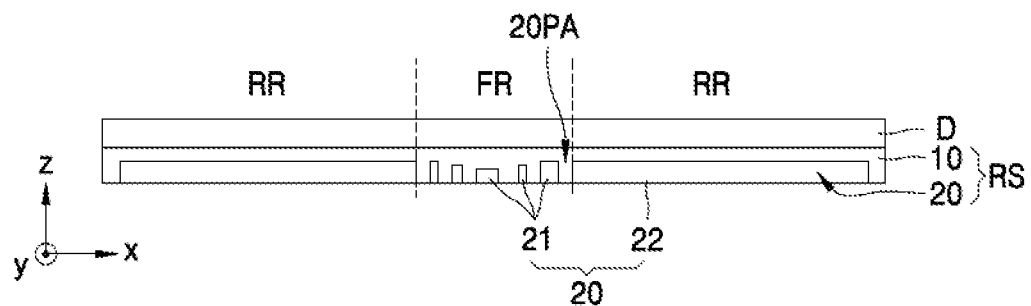
FIGS. 5A and 5B are schematic cross-sectional views of a display device, according to another example embodiment.
Figure 5B:
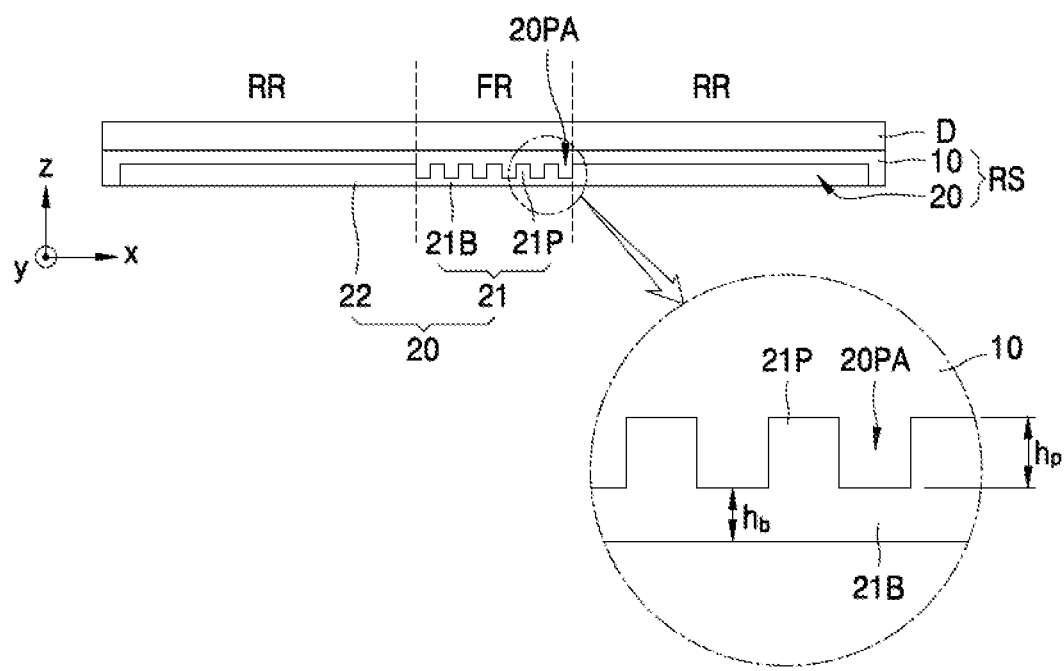

FIGS. 5A and 5B are schematic cross-sectional views of a display device, according to another example embodiment.

According to an example embodiment, in the flexible region FR, the first reinforced layer 20 may include a plurality of patterns 21 spaced apart from one another, wherein the plurality of patterns 21 may have widths, heights, and/or shapes that different from one another.

Referring to FIG. 5A, the height of the patterns 21 of the first reinforced layer 20 in the flexible region FR become smaller toward a center of the display device, and the widths of the patterns 21 of the first reinforced layer 20 are also different from one another. However, it is merely an example, and the width of the patterns 21 of the first reinforced layer 20 in the flexible region FR and the width, the height, and the shape, of the patterned spaces 20PA may be adjusted based on a curvature radius and impact resistance desired for the display device. According to one embodiment, the patterns 21 of the first reinforced layer 20 may have different sizes and shapes, and the patterned spaces 20PA may be varied according to a position within the flexible region FR. For example, the patterns 21 formed closer to a center of the flexible region FR may be made thicker or thicker compared to the patterns formed closer to a boundary between the flexible region FR and the reinforced region RR, and the spaces 20PA formed closer to the center of the flexible region FR may be made narrower or wider compared to the patterns formed closer to the boundary between the flexible region FR and the reinforced region RR.

FIG. 5B is a schematic cross-sectional view of a display device, according to another example embodiment. According to this embodiment, in the flexible region FR, the first reinforced layer 20 may include a supporter 21B and a convex portion 21P protruding from the supporter 21B. Referring to FIG. 5B, unlike the embodiments of FIGS. 1 and 4 including a plurality of patterns apart from one another, the first reinforced layer 20 may have a plate-like structure including patterns connected to one another. In this example, the first reinforced layer 20 has a concavo-convex shape in the flexible region FR. Since the supporter 21B of the first reinforced layer 20 in the flexible region FR has a small thickness smaller than the thickness of the reinforced layer 22 in the reinforced region RR, the stiffness of the first reinforced layer 20 in the flexible region FR is not too high, and thus the first reinforced layer 20 may be bent in the flexible region FR. To this end, a thickness $h_p$ of the convex portion 21P may be greater than a thickness $h_b$ of the supporter 21B. According to one embodiment, the first reinforced layer 20 that is integrally formed as shown in FIG. 5B may also be patterned in various shapes and sizes to include convex portions 21P similar to the patterns 21 shown in FIG. 4.

According to an example embodiment, the first substrate 10 may fill the patterned spaces 20PA of the flexible region FR. Referring to FIGS. 1 and 58B, the first reinforced layer 20 fills the spaces 20PA. In other words, the first substrate 10 fills the spaces 20PA formed between the adjacent patterns 21 in the flexible region FR. In a structure as described above, the first substrate 10 and the first reinforced layer 20 are interlocked with each other to provide a strong adhesion between the first substrate 10 and the first reinforced layer 20.

FIGS. 6 through 9 are schematic cross-sectional views of display devices, according to other example embodiments, respectively.

Figure 6:
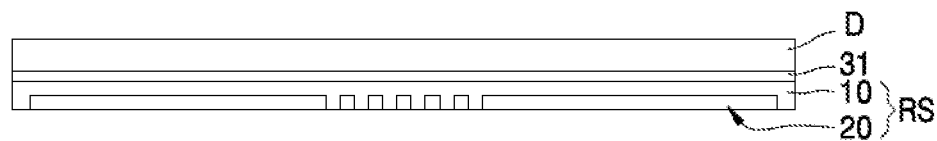
FIGS. 6 through 9 are schematic cross-sectional views of display devices, according to other example embodiments, respectively.

According to an example embodiment, the display device may further include a first barrier layer 31 disposed on the reinforced substrate RS. Referring to FIG. 6, the first barrier layer 31 is disposed on the first substrate 10 of the reinforced substrate RS. Since the first substrate 10 includes a flexible material, the first substrate 10 may be more susceptible to the ingress of moisture or oxygen therethrough compared to a glass substrate, degrading the image quality and deteriorating the lifespan of the display layer D. The first barrier layer 31 is disposed between the display layer D and the first substrate 10 to provide a blockage of moisture or oxygen toward the display layer D from the bottom of the first substrate 10.

The first barrier layer 31 may include an inorganic material, such as a metal oxide, a silicon nitride, or a silicon oxide, but is not limited thereto. The first barrier layer 31 may include a single layer film or a multilayered film.

The display device according to an example embodiment may further include a second substrate 40 that is disposed on the first barrier layer 31 and is flexible, and a second barrier layer 32 disposed on the second substrate 40.

Figure 7:
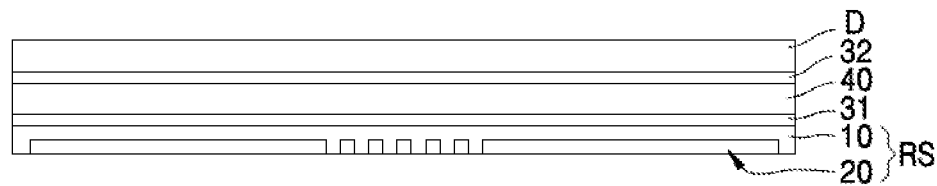

Referring to FIG. 7, the second substrate 40 is disposed on a first barrier layer 31, the second barrier layer 32 is disposed on the second substrate 40, and the display layer D is disposed on the second barrier layer 32. The second substrate 40 may include various flexible materials. For example, the second substrate 40 may include a polymer resin, such as polyethersulphone (PES), polyacrylate (PAR), polyetherimide (PEI), polyethylene (PEN), polyethyleneterephthalate (PET), polyphenylene sulfide (PPS), polyallylate, polyimide (PI), polycarbonate (PC), polycarbonate, or cellulose acetate propionate (CAP). According to an example embodiment, the second substrate 40 may have a thickness ranging from several micrometers (μm) to tens of micrometers. The first substrate 10 and the second substrate 40 may include a same material.

The second barrier layer 32 is disposed on the second substrate 40. Since the second substrate 40 includes a flexible material, the second substrate 40 may be more susceptible to the ingress of moisture or oxygen therethrough compared to a glass substrate, degrading the image quality of the display layer D and the lifespan of the display layer D is deteriorated. The second barrier layer 32 is disposed between the display layer D and the second substrate 40 to provide an extra blockage of moisture or oxygen toward the display layer D from the bottom of the second substrate 40 in addition to the first barrier layer 31. The second barrier layer 32 may include an inorganic material, such as a metal oxide, a silicon nitride, or a silicon oxide, but is not limited thereto. The second barrier layer 32 may include a single layer film or a multilayered film. The second barrier layer 32 may include a same material as the first barrier layer 31.

The display device according to an example embodiment may further include the second substrate 40 that is disposed under the first substrate 10 and is flexible, and the second barrier layer 32 disposed on the second substrate 40.

Figure 8:
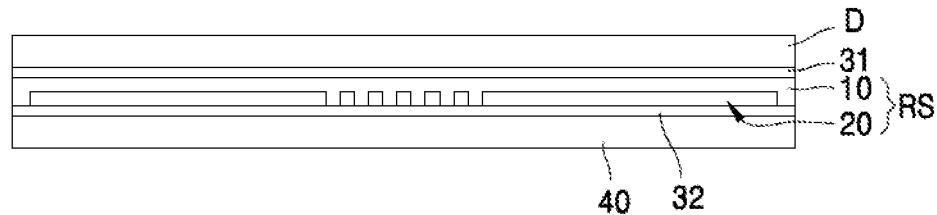

Referring to FIG. 8, the second barrier layer 32 is disposed under the reinforced substrate RS, and the second substrate 40 is disposed under the second barrier layer 32. In this example, the first reinforced layer 20 is surrounded by the first substrate 10 and the second barrier layer 32.

When the display device includes the two barrier layers 31 and 32 as in the embodiments of FIGS. 7 and 8, the display device may block the ingress of moisture or oxygen toward the display layer D more efficiently than a display device having one barrier layer, thereby improving the reliability of the display layer D.

The display device according to an example embodiment may include the flexible region FR and may further include a second reinforced layer 50. At least three surfaces of the second reinforced layer 50 may be surrounded by the second substrate 40.

Figure 9:
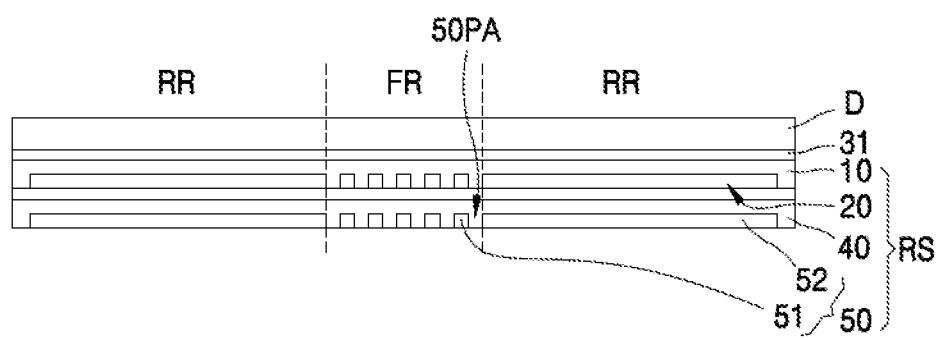

Referring to FIG. 9, the first reinforced layer 20 and the second reinforced layer 50 are disposed under the first substrate 10 and the second substrate 40, respectively. At least three surfaces of the second reinforced layer 50 may be surrounded by the second substrate 40, and particularly, the bottom surface of the second reinforced layer 50 may not be surrounded by the second substrate 40. In other words, the second reinforced layer 50 may not be completely surrounded by the second substrate 40.

The modulus of elasticity of the second reinforced layer 50 is greater than the modulus of elasticity of the second substrate 40. The second reinforced layer 50 includes a material harder than the material of the second substrate 40. Due to the second reinforced layer 50 in addition to the first reinforced layer 20, the overall strength of the display device is increased.

According to an example embodiment, the second reinforced layer 50 may include a conductive metal. The conductive metal may include any one selected from a group including molybdenum (Mo), titanium (Ti), and silver (Ag).

According to an example embodiment, the second reinforced layer 50 may include a conductive flexible film. The conductive flexible film may include any one selected from a group including carbon nanotubes (CNTs) and graphene. Carbon-based materials, such as carbon nanotubes (CNTs) and graphene, may have a modulus of elasticity around 1000 GPa that is greater than a modulus of elasticity of the conductive metal. In other words, since carbon nanotubes (CNTs) and graphene are stronger than metals, the thicknesses of the carbon nanotubes (CNTs) and the graphene may be smaller than thicknesses of conductive metals to achieve the same strength.

According to an example embodiment, the second reinforced layer 50 may include an inorganic material. The modulus of elasticity of the second reinforced layer 50 may be equal to or greater than 10 GPa. Here, the inorganic material may include a silicon oxide ($SiO_x$) or a silicon nitride ($SiN_x$) that is non-conductive.

The second reinforced layer 50 has a modulus of elasticity as described above and may be difficult to bend.

However, when the second reinforced layer 50 is patterned to have a plurality of patterns 51 as shown in FIG. 9, the patterned region becomes bendable due to a space 50PA between the adjacent patterns 51 of the first reinforced layer 50. Therefore, the region in which the second reinforced layer 50 is patterned corresponds to the flexible region FR of the reinforced substrate RS. On the other hand, the unpatterned region corresponds to the reinforced region RR of the reinforced substrate RS.

FIG. 9 shows that the flexible region FR in which the first reinforced layer 20 is patterned and the flexible region FR in which the second reinforced layer 50 is patterned overlap each other planarly, however the embodiments are not limited thereto. In other words, the region in which the first reinforced layer 20 is patterned and the region in which the second reinforced layer 50 is patterned may be located at different locations. The thickness and the patterned shape of the first reinforced layer 20 may also be different from the thickness and the patterned shape of the second reinforced layer 50. For example, although not shown in FIG. 9, when the first reinforced layer 20 may include the flexible region FR and the reinforced region RR and the second reinforced layer 50 includes only the flexible region FR at a location corresponding to the first reinforced layer 20, the strength of the flexible region FR may be improved while maintaining the flexible characteristics of the display device.

Figure 10:
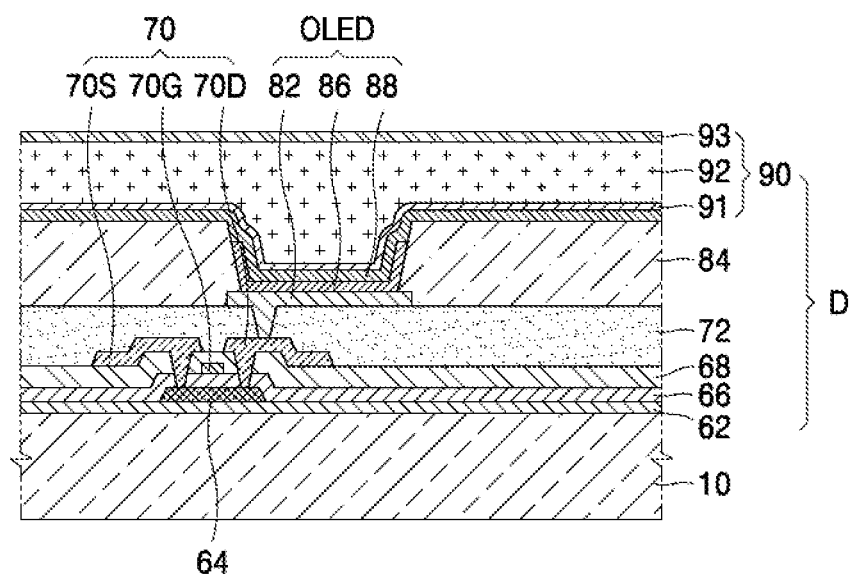
FIG. 10 is a cross-sectional view of A of FIG. 1. The display layer D displays an image.

FIG. 10 is a cross-sectional view of the area A shown in FIG. 1. The display layer D is configured to display an image. The display layer D may include any one of an organic light emitting display (OLED) layer, a liquid crystal display (LCD) layer, and an electrophoretic display (EPD) layer, but is not limited thereto. Hereinafter, an example case where the display layer D is an OLED layer will be described for convenience.

According to an example embodiment, the display layer D includes a pixel electrode 82 disposed on the first substrate 10, a pixel defining layer 84 that is disposed on the pixel electrode 82 and includes an opening exposing at least a portion of the pixel electrode 82, an intermediate layer 86 that is disposed on the pixel electrode 82 and includes an emission layer, and a counter electrode 88 disposed on the intermediate layer 86.

Referring to FIG. 10, a buffer layer 62 including an inorganic material, such as a silicon oxide, a silicon nitride, and/or a silicon oxynitride, may be disposed on the first substrate 10. The buffer layer 62 may improve the planarity of the top surface of the first substrate 10 or prevent or minimize penetration of impurities through the first substrate 10 into an active layer 64 of a thin-film transistor 70. Although not shown, the first barrier layer 31 may be further disposed between the first substrate 10 and the buffer layer 62. In some embodiments, the buffer layer 62 may be omitted.

The thin film transistor 70 may be disposed on the first substrate 10, and the thin film transistor 70 may be electrically connected to the pixel electrode 82. The thin-film transistor 70 includes the active layer 64 including a semiconductor material, such as amorphous silicon, polycrystalline silicon, an oxide semiconductor, or an organic semiconductor material, a gate electrode 70G insulated from the active layer 64, and a source electrode 70S and a drain electrode 70D that are electrically connected to the active layer 64. The gate electrode 70G is disposed on the active layer 64, where the source electrode 70S and the drain electrode 70D are electrically connected with each other according to a signal applied to the gate electrode 70G. The gate electrode 70G may include a single layer or a plurality of layers including one or more of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

A first insulation layer 66 including an inorganic material, such as a silicon oxide, a silicon nitride, and/or a silicon oxynitride, may be disposed between the active layer 64 and the gate electrode 70G to provide insulation between the active layer 64 and the gate electrode 70G. Furthermore, a second insulation layer 68 including an inorganic material, such as a silicon oxide, a silicon nitride, and/or a silicon oxynitride, may be disposed on the gate electrode 70G, and the source electrode 70S and the drain electrode 70D may be disposed on the second insulation layer 68. The source electrode 70S and the drain electrode 70D are electrically connected to the active layer 64 through contact holes formed in the second insulation layer 68 and the first insulation layer 66.

A third insulation layer 72 covering the thin-film transistor 70 may be disposed on the thin-film transistor 70. The third insulation layer 72 may have a flat top surface, such that the pixel electrode 82 disposed thereon becomes flat. The third insulation layer 72 may include an organic material, such as acryl, benzocyclobutene (BCB), polyimide, or hexamethyldisiloxane (HMDSO). Although FIG. 10 shows that the third insulation layer 72 is a single layer, the third insulation layer 72 may include a plurality of layers.

The third insulation layer 72 includes a via hole exposing any one of the source electrode 70S and the drain electrode 70D of the thin-film transistor 70, and the pixel electrode 82 contacts any one of the source electrode 70S and the drain electrode 70D through the via hole and is electrically connected to the thin-film transistor 70. FIG. 10 shows that the pixel electrode 82 is connected to the drain electrode 70D as an example.

An organic light emitting device OLED including the pixel electrode 82, the intermediate layer 86 that is disposed on the pixel electrode 82 and includes an emission layer, and the counter electrode 88 is disposed on the third insulation layer 72.

The pixel electrode 82 may be disposed as a reflective electrode. In this case, the pixel electrode 82 may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof and a transparent conductive layer disposed above and/or below the reflective film. The transparent conductive layer may include at least one selected from a group including indium tin oxide (ITO), indium zinc oxide (IZO), zinc oxide (ZnO), indium oxide ($In_2O_3$), indium gallium oxide (IGO), and Al-doped ZnO (AZO). However, embodiments are not limited thereto, and various modifications may be made. For example, the pixel electrode 82 may include various materials and may include a single layer or a plurality of layers.

The pixel defining layer 84 covering edge regions of the pixel electrode 82 may be disposed on the third insulation layer 72. The pixel defining layer 84 includes an opening exposing at least a portion of the pixel electrode 82 and defines a pixel region. The pixel defining layer 84 may include an organic material, for example, polyimide (PI) or hexamethyldisiloxane (HMDSO). The pixel defining layer 84 may include a single layer or a plurality of layers.

The intermediate layer 86 is disposed on a portion of the pixel electrode 82 that is exposed by the pixel defining layer 84. The intermediate layer 86 includes an emission layer (EML) and may further include one or more functional layers, such as a hole injection layer (HIL), a hole transport layer (HTL), an electron transport layer (ETL), and an electron injection layer (EIL).

However, the structure of the intermediate layer 86 is not limited thereto, and the intermediate layer 86 may have various other structures. The intermediate layer 86 may include an integrated layer over the plurality of pixel electrodes 82 and may include one or more patterned layers respectively corresponding to the plurality of pixel electrodes 82.

The counter electrode 88 is disposed on the intermediate layer 86. Unlike the pixel electrode 82, the counter electrode 88 may be integrally disposed over a plurality of pixels.

The counter electrode 88 may include a (semi) transparent electrode. In this case, the counter electrode 88 may include one or more selected from silver (Ag), aluminum (Al), magnesium (Mg), lithium (Li), calcium (Ca), copper (Cu), lithium fluoride/calcium (LiF/Ca), lithium fluoride/aluminum (LiF/Al), magnesium-silver alloy (MgAg), and calcium-silver alloy (CaAg) and may be disposed as a thin-film having a thickness ranging from several nanometers (nm) to tens of nanometers. However, the structures and materials of the counter electrode 88 are not limited thereto, and various modifications may be made.

A thin-film encapsulating layer 90 may be disposed on the counter electrode 88. The thin-film encapsulating layer 90 serves to seal the OLED preventing an exposure to the outside air or impurities. The thickness of the thin-film encapsulating layer 90 may be thin enough to be used as an encapsulating member for a flexible display device that may be bent or folded.

The thin-film encapsulating layer 90 may include a first inorganic layer 91, an organic layer 92, and a second inorganic layer 93 that are sequentially disposed on the counter electrode 88. The first inorganic layer 91 may include a silicon oxide, a silicon nitride, and/or a silicon oxynitride. Since the first inorganic layer 91 is disposed along a structure therebelow, the top surface of the first inorganic layer 91 may not be flat, as shown in FIG. 10. The organic layer 92 may cover the first inorganic layer 91 to provide a flat top surface. The organic layer 92 includes one or more selected from a group including polyethylene terephthalate, polyethylene naphthalate, polycarbonate, polyimide, polyethylene sulfonate, polyoxymethylene, polyarylate, and hexamethyldisiloxane. The second inorganic layer 93 may cover the organic layer 92 and may include a silicon oxide, a silicon nitride, and/or a silicon oxynitride. Although FIG. 10 shows that the thin-film encapsulating layer 90 includes the only one organic layer 92, the thin-film encapsulating layer 90 may have a structure in which a plurality of organic layers and inorganic layers are alternately stacked.

A conventional flexible organic light-emitting display device may include a thin-film transistor and a thin-film encapsulating layer having a low strength, cracks (e.g., DC of FIG. 2A) occur at an inorganic layer of the thin-film encapsulating layer and an inorganic layer of the thin-film transistor subject to an external impact. In this case, ON/OFF of a pixel may not be controlled or an emission layer may leak, and thus light may not be emitted from an intermediate layer even when a signal is applied to a pixel electrode.

On the contrary, when an object, such as a pen or a ball B, falls onto a display device including the above-described reinforced substrate RS and applies an impact thereto, the first reinforced layer 20 prevents the display layer D from being bent, thereby reducing the chance of cracks formed in the display layer D, for example, the first insulation layer 66, the second insulation layer 68, and the inorganic layers 91 and 93 of the thin-film encapsulating layer 90.

Figure 11A:
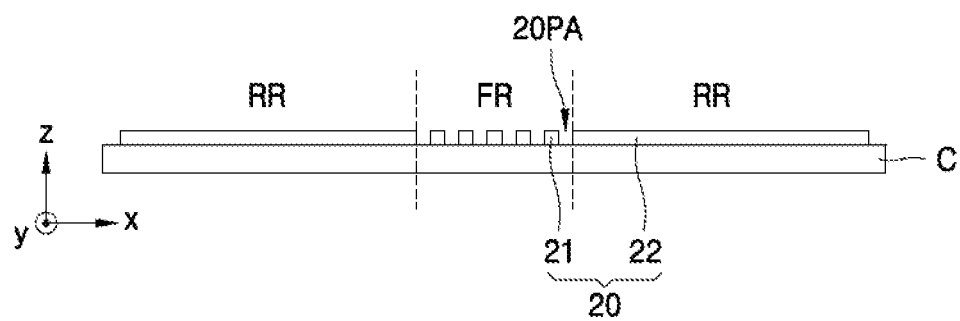
FIGS. 11A through 11C are cross-sectional diagrams sequentially showing a method of manufacturing the display device shown in FIG. 1.
Figure 11B:
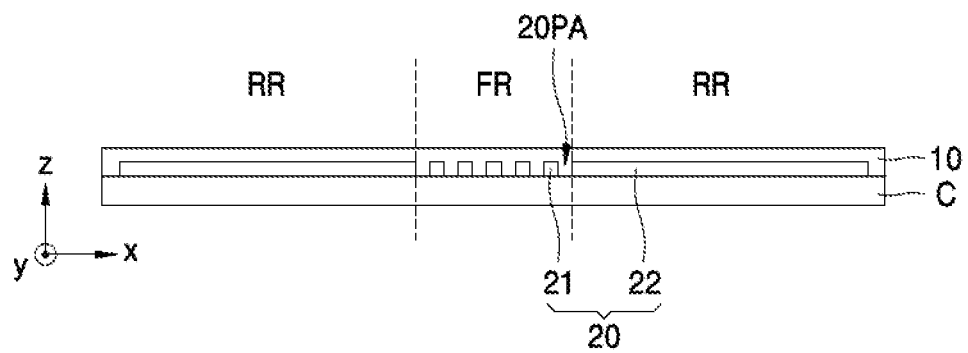
Figure 11C:
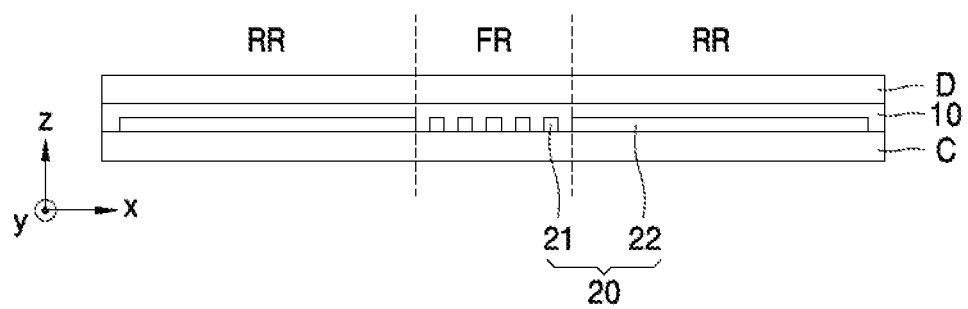

FIGS. 11A through 11C are cross-sectional diagrams sequentially showing a method of manufacturing the display device shown in FIG. 1.

The method of manufacturing the display device includes disposing the first reinforced layer 20 including the flexible region FR on a carrier substrate C, disposing a first substrate 10 having flexibility on the first reinforced layer 20, and disposing the display layer D for displaying an image on the first substrate 10. The modulus of elasticity of the first reinforced layer 20 is greater than the modulus of elasticity of the substrate 10.

Referring to FIG. 11A, the first reinforced layer 20 is disposed on the carrier substrate C. The carrier substrate C serves to support a display device manufactured later. The first reinforced layer 20 includes the flexible region FR. The first reinforced layer 20 may be patterned by depositing the first reinforced layer 20 on the entire carrier substrate C and performing an etching operation using a mask (not shown).

The first reinforced layer 20 may be patterned to include the plurality of patterns 21 that are spaced apart from one another as shown in FIG. 1 or may be patterned to have the supporter 21B and the convex portion 21P as shown in FIG. 5B.

The first reinforced layer 20 may include a conductive material. The conductive material may include any one selected from a group including molybdenum (Mo), titanium (Ti), silver (Ag), carbon nanotubes (CNT), and graphene. When the first reinforced layer 20 includes a conductive material, EMI may be shielded without arranging a separate EMI shielding film. In this case, the modulus of elasticity of the first reinforced layer 20 is greater than the modulus of elasticity of the first substrate 10 to be disposed later.

According to an example embodiment, the first reinforced layer 20 may include an inorganic material. The modulus of elasticity of the first reinforced layer 20 may be equal to or greater than 10 GPa. The inorganic material may include a silicon oxide ($SiO_x$) or a silicon nitride ($SiN_x$) that is non-conductive.

Referring to FIG. 11B, the first substrate 10 having flexibility is disposed on the first reinforced layer 20 that are patterned. The first substrate 10 is disposed by applying an organic resin mixed with an organic precursor and an organic solvent onto the first reinforced layer 20 and the carrier substrate C and then curing the organic resin. For example, the organic resin may be a polyimide resin including a polyamic acid. When heat is applied to the polyimide resin, the polyamic acid is subjected to internal copolymerization by a thermal imidization reaction to form polyimide.

The thickness of the organic resin may vary according to a thickness of the first substrate 10. The carrier substrate C may be a flat glass plate that is chemically inert with the organic resin that is a raw material of the first substrate 10.

When a liquid-type organic resin is applied as described above, the patterned space 20PA of the first reinforced layer 20 is filled with the organic resin, and thus the first substrate 10 covers the patterned space 20PA of the first reinforced layer 20. In a structure as described above, the first substrate 10 and the first reinforced layer 20 are interlocked with each other to provide a strong adhesion between the first substrate 10 and the first reinforced layer 20.

Referring to FIG. 11C, the display layer D for displaying an image is disposed on the first substrate 10. The display layer D may be the organic light emitting display shown in FIG. 10. The display device shown in FIG. 1 is fabricated by removing the carrier substrate C.

Figure 12A:
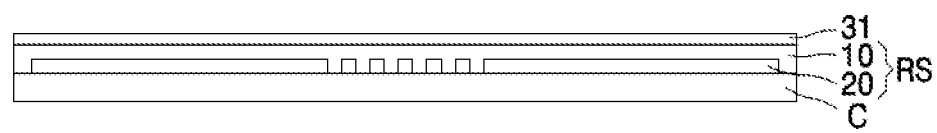
FIGS. 12A and 12B are cross-sectional diagrams sequentially showing a method of manufacturing the display device shown in FIG. 6.
Figure 12B:
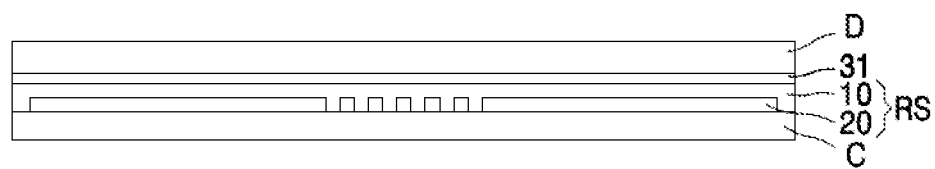

FIGS. 12A and 12B are cross-sectional diagrams sequentially showing a method of manufacturing the display device shown in FIG. 6. The method of manufacturing the display device may further include disposing the first barrier layer 31 on the first substrate 10 before disposing the display layer D.

Referring to FIG. 12A, the first barrier layer 31 may be disposed on the first substrate 10 between the processes shown in FIGS. 11B and 11C, that is, after disposing the first substrate 10 on the first reinforced layer 20 and before disposing the display layer D. The first barrier layer 31 may include an inorganic material, such as a metal oxide, a silicon nitride, or a silicon oxide, but is not limited thereto. The first barrier layer 31 may include a single layer film or a multilayered film.

Referring to FIG. 12B, the display device shown in FIG. 6 is manufactured by disposing the display layer D on the first barrier layer 31 and then removing the carrier substrate C.

Figure 13A:
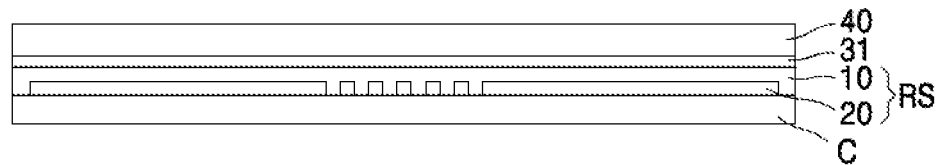
FIGS. 13A and 13B are cross-sectional diagrams sequentially showing a method of manufacturing the display device shown in FIG. 7.
Figure 13B:
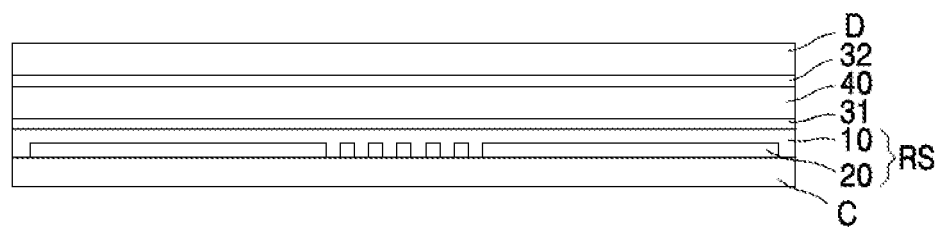

FIGS. 13A and 13B are cross-sectional diagrams sequentially showing a method of manufacturing the display device shown in FIG. 7. The method of manufacturing the display device may further include disposing the second substrate 40 having flexibility on the first barrier layer 31 and disposing the second barrier layer 32 on the substrate 40, after disposing the first barrier layer 31.

Referring to FIG. 13A, the second substrate 40 having flexibility may be disposed on the first barrier layer 31 between the processes shown in FIGS. 12A and 12B, that is, after disposing the first barrier layer 31 on the first substrate 10 and before disposing the display layer D.

An organic resin mixed with an organic precursor and an organic solvent is applied onto the first barrier layer 31 and then cured to dispose the second substrate 40. For example, the organic resin may be a polyimide resin including a polyamic acid. When heat is applied to the polyimide resin, the polyamic acid is subjected to internal copolymerization by a thermal imidization reaction to form polyimide.

The second substrate 40 may be disposed by curing a liquid organic resin as described above. Alternatively, the second substrate 40 that has a film-like shape and is fabricated in advance may be attached to the first barrier layer 31.

Referring to FIG. 13B, the second barrier layer 32 is disposed on the second substrate 40, the display layer D is disposed on the second barrier layer 32, and then the carrier substrate C is removed, thereby manufacturing the display device shown in FIG. 7.

Figure 14A:
FIGS. 14A through 14C are cross-sectional diagrams sequentially showing a method of manufacturing the display device shown in FIG. 8.
Figure 14B:
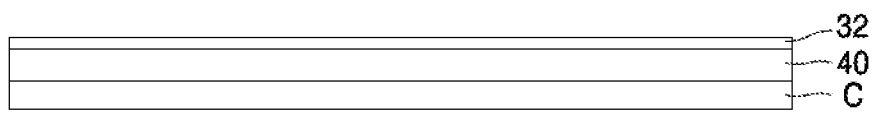
Figure 14C:
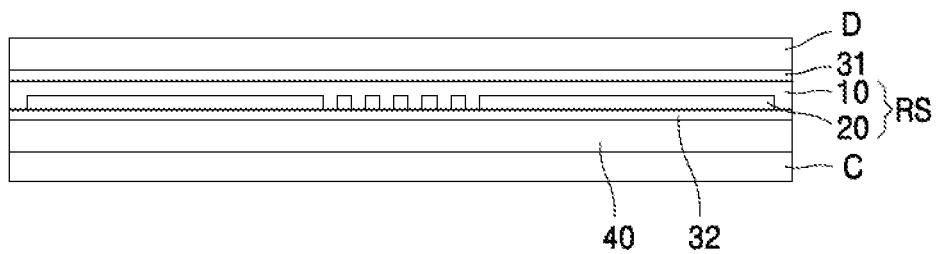

FIGS. 14A through 14C are cross-sectional diagrams sequentially showing a method of manufacturing the display device shown in FIG. 8. The method of manufacturing the display device may further include disposing the second substrate 40 having flexibility on the carrier substrate C and disposing the second barrier layer 32 on the second substrate 40, before disposing the first reinforced layer 20.

Referring to FIG. 14A, the second substrate 40 having flexibility may be disposed on the carrier substrate C before disposing the first reinforced layer 20 (see FIG. 11A).

An organic resin mixed with an organic precursor and an organic solvent is applied onto the first barrier layer 31 and then cured to dispose the second substrate 40. The second substrate 40 may be disposed by curing a liquid organic resin as described above. Alternatively, the second substrate 40 that has a film-like shape and is fabricated in advance may be attached to the first barrier layer 31.

Referring to FIG. 14B, after the second substrate 40 is disposed, the second barrier layer 32 is disposed on the second substrate 40. The second barrier layer 32 may include an inorganic material, such as a metal oxide, a silicon nitride, or a silicon oxide, but is not limited thereto. The second barrier layer 32 may include a single layer film or a multilayered film.

Referring to FIG. 14C, the first reinforced layer 20 is disposed on the second barrier layer 32 by using an etching process using a mask (not shown). Thereafter, the first substrate 10 having flexibility is disposed on the first reinforced layer 20. The first substrate 10 may be disposed by applying an organic resin mixed with an organic precursor and an organic solvent onto the first reinforced layer 20 and the carrier substrate C and then curing the organic resin. After the first barrier layer 31 is disposed on the first substrate 10 and the display layer D is disposed on the first barrier layer 31, the carrier substrate C is removed, and thus the display device shown in FIG. 8 is manufactured.

Figure 15A:
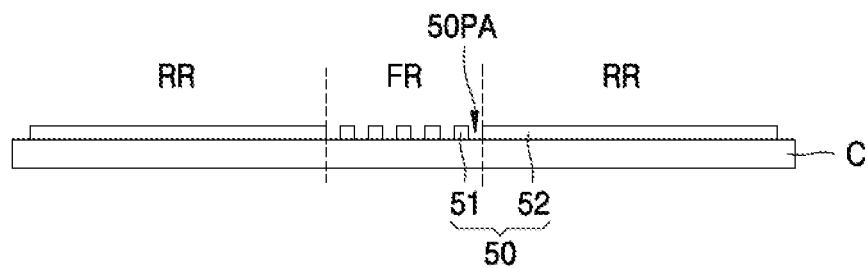
FIGS. 15A through 15C are cross-sectional diagrams sequentially showing a method of manufacturing the display device shown in FIG. 9.
Figure 15B:
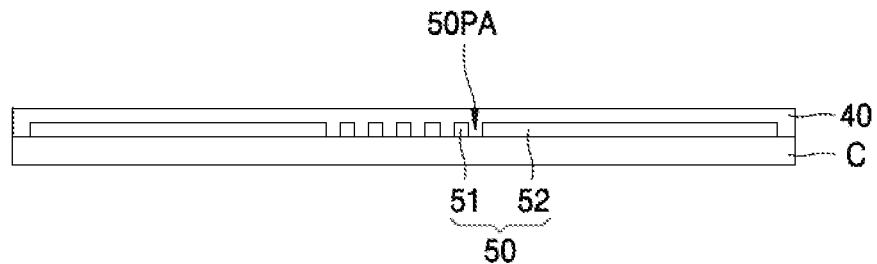
Figure 15C:
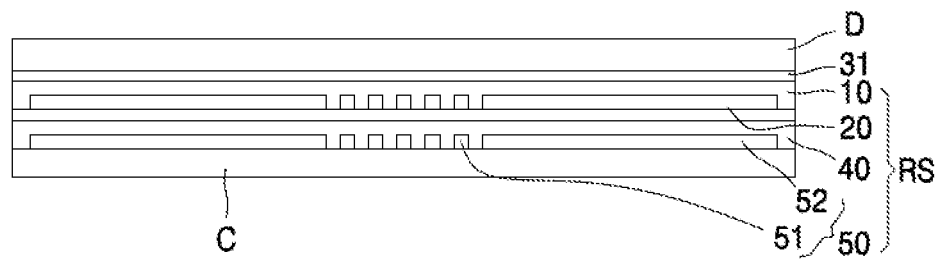

FIGS. 15A through 15C are cross-sectional diagrams sequentially showing a method of manufacturing the display device shown in FIG. 9.

The method of manufacturing the display device may further include disposing the second reinforced layer 50 including the flexible region FR on the carrier substrate C before disposing the second substrate 40. The modulus of elasticity of the second reinforced layer 50 may be greater than the modulus of elasticity of the second substrate 40.

Referring to FIG. 15A, the second reinforced layer 50 is disposed on the carrier substrate C. The modulus of elasticity of the second reinforced layer 50 is greater than the modulus of elasticity of the second substrate 40 to be disposed later. The second reinforced layer 50 includes the flexible region FR. The second reinforced layer 50 may be patterned through an etching process using a mask (not shown) after the second reinforced layer 50 is entirely deposited on the carrier substrate C. The second reinforced layer 50 may be patterned to include the plurality of patterns 51 spaced apart from one another as shown in FIG. 9 or may be patterned to have a supporter and a convex portion connected to each other similarly as the first reinforced layer 20 shown in FIG. 5B.

The second reinforced layer 50 may include a conductive material. The conductive material may include at least one selected from a group including molybdenum (Mo), titanium (Ti), silver (Ag), carbon (CNT) nanotubes, and graphene. In this case, EMI may be shielded by the conductive material of the second reinforced layer 50 without arranging a separate EMI shielding film.

According to an example embodiment, the second reinforced layer 50 may include an inorganic material. The modulus of elasticity of the second reinforced layer 50 may be equal to or greater than 10 GPa. The inorganic material may include a silicon oxide ($SiO_x$) or a silicon nitride ($SiN_x$) that is non-conductive.

Referring to FIG. 15B, the second substrate 40 having flexibility is disposed on the second reinforced layer 50. The second substrate 40 is disposed by applying an organic resin mixed with an organic precursor and an organic solvent onto the second reinforced layer 50 and the carrier substrate C and then curing the organic resin. For example, the organic resin may be a polyimide resin including polyamic acid. When heat is applied to the polyimide resin, the polyamic acid is subjected to internal copolymerization by a thermal imidization reaction to form polyimide.

The thickness of the organic resin may vary according to a thickness of the second substrate 40. The carrier substrate C may be a flat glass plate that is chemically inert with an organic resin that is a raw material of the second substrate 40.

When the liquid organic resin is applied as described above, the patterned space 50PA of the second reinforced layer 50 is filled with the organic resin, and thus the second substrate 40 covers the patterned space 50PA of the substrate 20. In a structure as described above, the second substrate 40 and the second reinforced layer 50 are interlocked with each other to form a strong adhesion between the second substrate 40 and the second reinforced layer 50.

Referring to FIG. 15C, after the second substrate 40 is disposed, the second barrier layer 32 is disposed, the first reinforced layer 20 is disposed on the second barrier layer 32, the first substrate 10 is disposed on the first reinforced layer 20, the first barrier layer 31 is disposed on the first substrate 10, and the display layer D is disposed on the first barrier layer 31, and then the carrier substrate C is removed, thereby manufacturing the display device shown in FIG. 9.

A display device that is manufactured according to a method of manufacturing as described above includes the first reinforced layer 20 including the flexible region FR and has the modulus of elasticity greater than the modulus of elasticity of the first substrate 10. The strength of the display device may be improved while providing flexibility in the flexible region FR.

According to an example embodiment, a display device having an improved overall tensile strength while providing flexibility in the flexible region FR, and a method of manufacturing the same may be provided.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A display device comprising:
   a reinforced substrate having a flexible region and a reinforced region adjacent to the flexible region;
   a display layer disposed on the reinforced substrate and including a thin-film transistor, an organic light emitting display and a thin-film encapsulating layer, wherein the thin-film encapsulating layer is disposed on the organic light emitting display; and
   a first barrier layer configured to block moisture or oxygen toward the display layer and disposed between the reinforced substrate and the display layer,
   wherein the reinforced substrate comprises:
      a first reinforced layer comprising a reinforced portion disposed in the reinforced region and a plurality of patterns disposed in the flexible region, each of the plurality of patterns being disconnected from one another by respective ones of a plurality of patterned spaces and disconnected from the reinforced portion; and
      a first substrate that is disposed on the first reinforced layer and has flexibility,
   wherein a modulus of elasticity of the first reinforced layer is greater than a modulus of elasticity of the first substrate,
   wherein the first substrate surrounds at least three surfaces of the reinforced portion of the first reinforced layer,
   wherein the organic light emitting display includes a pixel electrode including a reflective electrode, an intermediate layer disposed on the pixel electrode, and a counter electrode disposed on the intermediate layer,
   wherein the organic light emitting display emits light in a direction opposite from the reinforced substrate, and
   wherein the light emitted from the organic light emitting display is emitted to outside of the display device through the thin-film encapsulating layer.

2. The display device of claim 1, wherein the first substrate surrounds at least three surfaces of the first reinforced layer including two side surfaces and an upper surface facing the first substrate.

3. The display device of claim 1, wherein a bottom surface of the first reinforced layer is exposed without being surrounded by the first substrate.

4. The display device of claim 1, wherein the first reinforced layer includes an inorganic material.

5. The display device of claim 1, wherein the first reinforced layer comprises a conductive material.

6. The display device of claim 5, wherein the conductive material comprises any one selected from a group including molybdenum (Mo), titanium (Ti), silver (Ag), carbon nanotubes (CNT), and graphene.

7. The display device of claim 1, wherein the first pattern, the second pattern, and the third pattern have different widths.

8. The display device of claim 1, wherein the plurality of patterns in the flexible region has different sizes and shapes.

9. The display device of claim 1, wherein the first reinforced layer comprises a plurality of flexible regions.

10. The display device of claim 1, wherein, in the flexible region, the first reinforced layer comprises a supporter and a convex portion protruding from the supporter.

11. The display device of claim 1, wherein the first substrate fills the plurality of patterned spaces between adjacent patterns of the first reinforced layer in the flexible region.

12. The display device of claim 1, further comprising:
   a second substrate that is disposed on the first barrier layer and has flexibility; and
   a second barrier layer disposed on the second substrate.

13. The display device of claim 1, further comprising:
   a second substrate that is disposed below the first substrate and has flexibility; and
   a second barrier layer disposed on the second substrate.

14. The display device of claim 1, further comprising a second substrate and a second reinforced layer comprising a second flexible region and surrounded by the second substrate on at least three surfaces,
   wherein a modulus of elasticity of the second reinforced layer is greater than a modulus of elasticity of the second substrate.

* * * * *